(12) United States Patent
Tanaka et al.

(10) Patent No.: US 8,878,123 B2
(45) Date of Patent: Nov. 4, 2014

(54) LENS SHEET AND PHOTOELECTRIC CONVERSION MODULE

(75) Inventors: Koichiro Tanaka, Kanagawa (JP); Emi Koezuka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 325 days.

(21) Appl. No.: 13/412,016

(22) Filed: Mar. 5, 2012

(65) Prior Publication Data

US 2012/0228481 A1 Sep. 13, 2012

(30) Foreign Application Priority Data

Mar. 11, 2011 (JP) .................. 2011-054598

(51) Int. Cl.
*H01J 40/14* (2006.01)
*H01L 31/052* (2014.01)
*G02B 3/00* (2006.01)

(52) U.S. Cl.
CPC ............ *H01L 31/0524* (2013.01); *G02B 3/005* (2013.01); *Y02E 10/52* (2013.01)
USPC .................... 250/216; 250/214.1; 359/642

(58) Field of Classification Search
CPC ............... G02B 3/005; G02B 27/0955; G02B 27/0961; G02B 27/0966; G02B 27/072; G02B 27/2214; G02F 2001/133607; H04N 13/0404
USPC ........... 250/214.1, 208.1, 216, 237 R, 237 G; 359/455, 463, 619, 625, 642; 349/57; 136/246, 256

See application file for complete search history.

(56) References Cited

U.S. PATENT DOCUMENTS 4,053,327 A * 10/1977 Meulenberg, Jr. ............ 136/256
4,711,972 A    12/1987 O'Neill

FOREIGN PATENT DOCUMENTS

| JP | 63-102279 |   | 5/1988 |
|----|-----------|---|--------|
| JP | 10253916 A | * | 9/1998 |
| JP | 11-142622 |   | 5/1999 |
| JP | 2009-162843 |  | 7/2009 |

* cited by examiner

*Primary Examiner* — Kevin Pyo
(74) *Attorney, Agent, or Firm* — Nixon Peabody LLP; Jeffrey L. Costellia

(57) ABSTRACT

A lens sheet is provided which is configured to create, below the lens sheet, a region not irradiated with light when light is incident on the lens sheet from above. A photoelectric conversion element is efficiently irradiated with light incident on the lens sheet. In addition, a high-efficiency photoelectric conversion module is provided. The lens sheet includes a light-transmitting substrate having lens arrays on both sides, and the lens arrays each have lens regions and non-lens regions placed alternately (in stripes), in which an end portion of each lens region on the front side overlaps with an end portion of each lens region on the back side.

10 Claims, 15 Drawing Sheets

LENS SHEET AND PHOTOELECTRIC CONVERSION MODULE

BACKGROUND OF THE INVENTION

1. Field of the invention

The present invention relates to a lens sheet and a photoelectric conversion module.

2. Description of the Related Art

In recent years, solar power generation systems have attracted attention as a sustainable energy source and are expected to be more efficient. One method for improving the efficiency of solar power generation systems is to effectively irradiate a photoelectric conversion element with light.

Some photoelectric conversion modules used in solar power generation systems have a structure in which grid electrodes are provided on top of a photoelectric conversion element. In that case, electric current generated by the photoelectric conversion element is taken out through the grid electrodes. The grid electrodes can decrease electric resistance in taking out current, but at the same time decreases the size of light-receiving portions of the photoelectric conversion element by the area of the grid electrodes, which results in a decrease in conversion efficiency.

Therefore, a method of using lenses to effectively utilize light to be incident on the grid electrodes is disclosed in Patent Document 1, for example. A photoelectric conversion module disclosed in Patent Document 1 includes a series of prismatic lenses or cylindrical lenses over a photoelectric conversion element and grid electrodes. Furthermore, boundaries between the lenses are disposed to be above the grid electrodes. Accordingly, light incident on portions above the grid electrodes is refracted so as to be focused to light-receiving portions, whereby incident light can be effectively utilized.

On the other hand, for effective utilization of light in a liquid crystal display, a lens sheet for effectively irradiating liquid crystal with light from a backlight has been developed. For example, a lens sheet having, on both sides, arrays of series of lenses which are shifted from each other by 0 or half the pitch is disclosed in Patent Document 2.

REFERENCES

[Patent Document 1] Japanese Published Patent Application No. S63-102279

[Patent Document 2] Japanese Published Patent Application No. 2009-1.62843

SUMMARY OF THE INVENTION

However, such a lens array having a series of lenses as disclosed in Patent Document 1 and Patent Document 2 cannot practically have an ideal shape because there is a limitation on processing accuracy. Therefore, even if it is ideally desirable to form lens surfaces so as to be adjacent to each other with no space there-between, it is practically inevitable that round regions or flat regions which do not sufficiently function as lenses are created between the lens surfaces. Light incident on the round regions or the flat regions travels rectilinearly without being refracted satisfactorily.

FIGS. 15A and 15B are cross-sectional views of photoelectric conversion modules in which lens sheets 300 and 301 disclosed in Patent Document 1 are employed. Each photoelectric conversion module includes the lens sheet 300 or 301, a photoelectric conversion element 200, and grid electrodes 201. In FIGS. 15A to 15C, dotted lines indicate the traveling direction of light. As illustrated in FIGS. 15A and 15B, there are round regions or flat regions at boundaries between lenses of the lens sheets 300 and 301; thus, light incident on these regions travels rectilinearly without being refracted satisfactorily and is delivered to the grid electrodes 201. Accordingly, part of light incident on the lens sheets 300 and 301 cannot be utilized for photoelectric conversion.

The same applies to a photoelectric conversion module in which a lens sheet disclosed in Patent Document 2 is employed. FIG. 15C is a cross-sectional view of a photoelectric conversion module in which a lens sheet 302 disclosed in Patent Document 2 is employed. Here, a light incident side of the lens sheet 302 is referred to as a first side, and a side thereof facing a photoelectric conversion element is referred to as a second side. The lens sheet 302 also includes a series of lenses; thus, in boundary portions between lens regions on the first side, there are round regions or flat regions which do not sufficiently function as lenses. Therefore, light incident on the boundary portions between the lens regions on the first side travels rectilinearly without being refracted satisfactorily. In addition, the light is incident on lens regions on the second side at substantially 0° and is therefore not refracted satisfactorily even by the lens regions on the second side. Accordingly, light is delivered to the grid electrodes 201 and cannot be utilized for photoelectric conversion.

As described above, in a conventional lens array, there are regions at boundaries between lenses where light cannot be effectively utilized.

In view of the above description, it an object of one embodiment of the present invention to provide a lens sheet which is configured to create, below the lens sheet, a region not irradiated with light when light is incident on the lens sheet from above, thereby enabling effective utilization of light incident on the lens sheet without loss. Another object is to provide a lens sheet capable of efficiently irradiating a photoelectric conversion element with light. Another object is to provide a high-efficiency photoelectric conversion module.

In order to achieve the above objects, in a lens sheet in one embodiment of the present invention, lens regions which are cylindrical lenses or prismatic lenses and non-lens regions are disposed alternately (in other words, in stripes).

One embodiment of the present invention is a lens sheet including a first lens array on a front side and a second lens array on a back side. The first lens array includes a first lens region and a first non-lens region which are placed alternately. The second lens array includes a second lens region and a second non-lens region which are placed alternately. A middle portion of the first lens region overlaps with the second non-lens region. The first non-lens region overlaps with a middle portion of the second lens region. An end portion of the first lens region overlaps with an end portion of the second lens region.

In the above embodiment, a relationship expressed by Formula (1) below is established, where D is the width of the first lens region, d is the width of the second non-lens region, t is the thickness of the lens sheet, R is the curvature radius of the first lens region, n is the refractive index of the lens sheet, α is the width of a region of the second non-lens region from which light incident on and focused by the first lens region exits, and C is a constant satisfying 4.4<C<4.6, and where a region not irradiated with light when light is incident on the first lens array and exits from the second lens array can be created below the second lens array.

[Formula (1)]

$$d \geq \alpha = D\frac{RC - tn}{RC} \qquad (1)$$

In the above embodiment, at least one of the first lens region and the second lens region may be a cylindrical lens.

In the above embodiment, at least one of the first lens region and the second lens region may be a prismatic lens.

Another embodiment is a photoelectric conversion module including the aforementioned lens sheet, a photoelectric conversion element below the lens sheet with the first lens array on an upper side and the second lens array on a lower side, and a grid electrode over the photoelectric conversion element. The photoelectric conversion element and the grid electrode are disposed such that the grid electrode is positioned in a region which is created below the second lens array and which is not irradiated with light.

Note that the term "cylindrical lens" refers to a lens whose cross-sectional shape is a circular arc or an elliptical arc.

According to one embodiment of the present invention, a lens sheet can be provided which is configured to create, below the lens sheet, a region not irradiated with light when light is incident on the lens sheet from above, thereby enabling effective utilization of light incident on the lens sheet without loss. In addition, a lens sheet capable of efficiently irradiating a photoelectric conversion element with light can be provided. Furthermore, a high-efficiency photoelectric conversion module can be provided.

DETAILED DESCRIPTION OF THE INVENTION

Figure 1A:
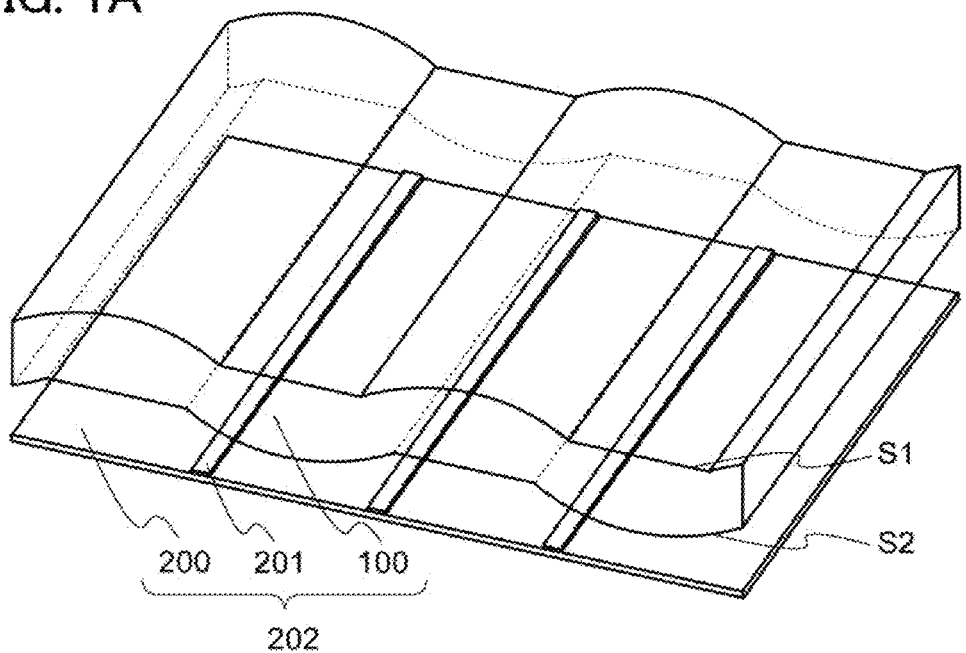
FIGS. 1A and 1B are a perspective view and a cross-sectional view illustrating an example of a lens sheet and a photoelectric conversion module.

Examples of embodiments of the present invention will be described below with reference to drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

Note that ordinal numbers such as "first" and "second" in this specification and the like are used in order to avoid confusion among components, and the terms do not limit the components numerically.

Embodiment 1

In this embodiment, an example of a lens sheet and an example of disposition of a lens sheet and a photoelectric conversion module will be described with reference to FIGS. 1A and 1B and FIG. 2.

<Lens Sheet>

Figure 1B:
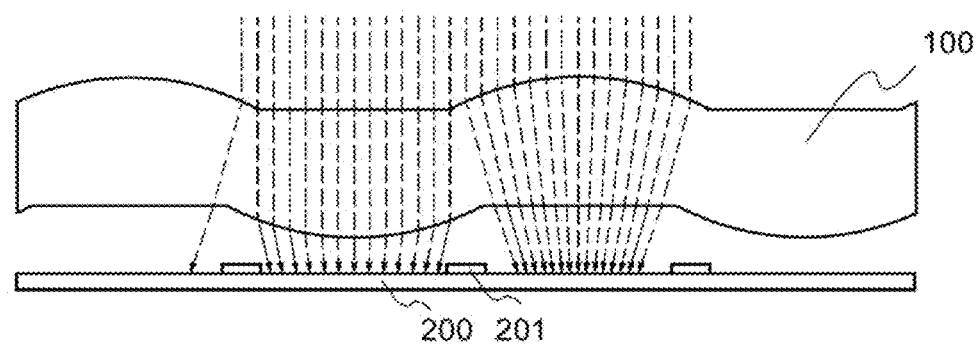
Figure 2:
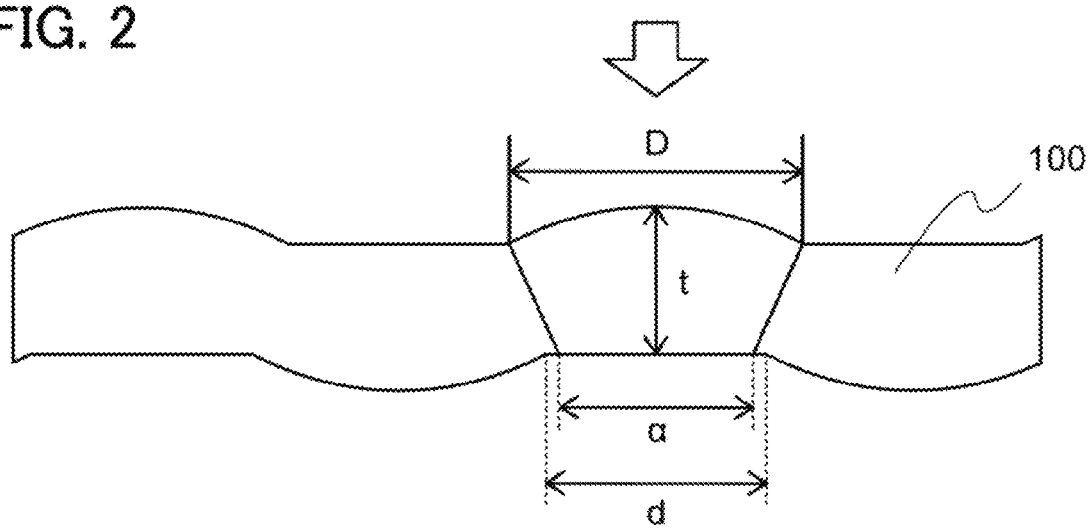
FIG. 2 is a cross-sectional view illustrating an example of a lens sheet.

FIGS. 1A and 1B illustrate a photoelectric conversion module 202 including a lens sheet 100 according to one embodiment of the present invention. FIG. 1A is a perspective view, and FIG. 1B is a cross-sectional view. As illustrated in FIG. 1A, the lens sheet 100 has, on a first side S1, first lens regions which are cylindrical lenses and first non-lens regions which are portions other than the lens regions. The lens sheet 100 also has second lens regions which are cylindrical lenses and second non-lens regions on a second side S2 which is opposite to the first side. In the lens sheet 100, middle portions of the first lens regions overlap with the second non-lens regions, and the first non-lens regions overlap with middle portions of the second lens regions. In addition, end portions of the first lens regions overlap with end portions of the second lens regions.

Note that in this specification, the term "cylindrical lens" refers to a lens whose cross-sectional shape is a circular arc or an elliptical arc. Each of the end portion of the first lens region and the end portion of the second lens region which overlap with each other has a length of 20% or less from an end, preferably a length of 5% or less. The term "middle portion" refers to a portion other than an end portion.

The lens sheet 100 is formed using a light-transmitting material. The light-transmitting material preferably transmits 85% or more of fight entering the lens sheet. Examples thereof are an acrylic resin (a polymethyl methacrylate resin), a cyclic olefin polymer resin, a polyester resin, a polyacrylonitrile resin, a polyimide resin, a polycarbonate resin, a polyethersulfone resin, a polyamide resin, a polystyrene resin, a polyamide-imide resin, a polyvinylchloride resin, a polyethylene terephthalate (PET) resin, a silicone resin, an epoxy resin, a polysulfone resin, a vinylester resin, a maleimide resin, glass, crystal of quartz, fluorite, or the like, and a combination thereof.

When the first side of the lens sheet 100 is an upper side and the second side thereof is a lower side, a photoelectric conversion element 200 and grid electrodes 201 are disposed below the lower side of the lens sheet 100.

Light transmitted through the lens sheet 100 and delivered to the photoelectric conversion element 200 is converted into electric current and taken out through the grid electrodes 201.

The grid electrodes 201 enable the photoelectric conversion module 202 to have lower electric resistance in taking out current.

The shape of the lens sheet 100 will be described using FIG. 2 and Formula (1). Here, as for the lens sheet 100, as illustrated in FIG. 2, the width of the first lens region is denoted by D, the width of the second non-lens region, d, and the thickness, t. In addition, the lens curvature radius is R, and the refractive index of the lens sheet 100 is n. The width of a region on the second side from which light incident in the direction of an arrow in FIG. 2 and focused by the first lens region exits is spot a. Note that a denotes the width of a region from which light having an intensity of 1 to $1/e^2$ exits assuming the maximum intensity of light exiting from the second side is 1. Here, e is the base of the natural logarithm. In addition, the lens sheet 100 is surrounded by air (refractive index: n=1).

Regarding the lens sheet 100, a relationship expressed by Formula (1) below is established. Here, C is a constant satisfying 4.4<C<4.6.

[Formula (1)]

$$d \geq \alpha = D\frac{RC - tn}{RC} \quad (1)$$

As expressed by Formula (1), the spot α of a region of the second non-lens region from which light incident on the first lens region exits is smaller than or equal to the width d of the second non-lens region.

Light incident on the first non-lens region and exiting from the second lens region is focused by the second lens region.

When such a relationship is satisfied, a region not irradiated with light when light is incident on the lens sheet 100 from above is created below the lens sheet 100. In the photoelectric conversion module 202 including the lens sheet 100 satisfying such a relationship, the photoelectric conversion element can be efficiently irradiated with light. The disposition of the lens sheet 100, the photoelectric conversion element 200, and the grid electrodes 201 in the photoelectric conversion module including the lens sheet 100 will be described in detail below.

<Disposition of Lens Sheet and Photoelectric Conversion Module>

An example of disposition of the lens sheet 100 and the photoelectric conversion module 202 will be described with reference to FIG. 1B. Note that in each of FIGS. 1A and 1B, light is incident on the lens array at substantially 0°. The expression "substantially 0°" herein refers to the range from −5° to 5°. In FIG. 1B and FIG. 2, dotted lines indicate the travelling direction of light.

As illustrated in FIG. 1B, when light entering the lens sheet 100 from the first side exits from the second side in the photoelectric conversion module 202 in which the photoelectric conversion element 200 and the grid electrodes 201 are disposed below the lower side of the lens sheet 100, regions not irradiated with light are created below the portions where the end portions of the first lens regions overlap with the end portions of the second lens regions. The photoelectric conversion element 200 and the grid electrodes 201 are disposed such that the grid electrodes 201 are located in the regions not irradiated with light. The photoelectric conversion element 200 can be irradiated with light without loss by using the lens sheet 100 which is configured to create therebelow regions not irradiated with light when light is incident thereon from above and by disposing the lens sheet 100, the photoelectric conversion element 200, and the grid electrodes 201 as described above. Accordingly, the photoelectric conversion module 202 can have high efficiency.

Note that the curvature radius of the first lens region and the curvature radius of the second lens region are preferably long, as long as the grid electrodes 201 can be positioned in the regions not irradiated with light. In light-receiving portions of the photoelectric conversion element 200, regions closer to the grid electrodes 201 have lower resistance in taking out generated electric current. Therefore, photoelectric conversion efficiency can be improved by setting the curvature radii of the first lens region and the second lens region so that regions of the photoelectric conversion element 200 which are close to the grid electrodes 201 are also irradiated with light.

The width of the overlap between the first lens region and the second lens region can be set as appropriate depending on processing accuracy, refractive index, curvature radius, and the like. For example, if a region at the boundary between a lens region and a non-lens region which cannot be processed to have a designed curvature radius because of the limit of processing accuracy is 5% of the lens region, the overlap width is preferably set so as to exceed 5% of the lens region.

Embodiment 2

In this embodiment, modified examples of lens sheets and modified examples of disposition of a lens sheet, a photoelectric conversion element, and grid electrodes will be described with reference to FIGS. 3A and 3B, FIGS. 4A and 4B, FIGS. 5A and 5B, FIGS. 6A and 6B, and FIGS. 7A and 7B. Note that in FIGS. 3A and 3B, FIGS. 4A and 4B, FIGS. 5A and 5B, and FIGS. 6A and 6B, light is incident on the lens arrays at substantially 0°. In addition, in FIG. 3B, FIGS. 4A and 4B, FIG. 5B, and FIG. 6B, dotted lines indicate the traveling direction of light.

Figure 3A:
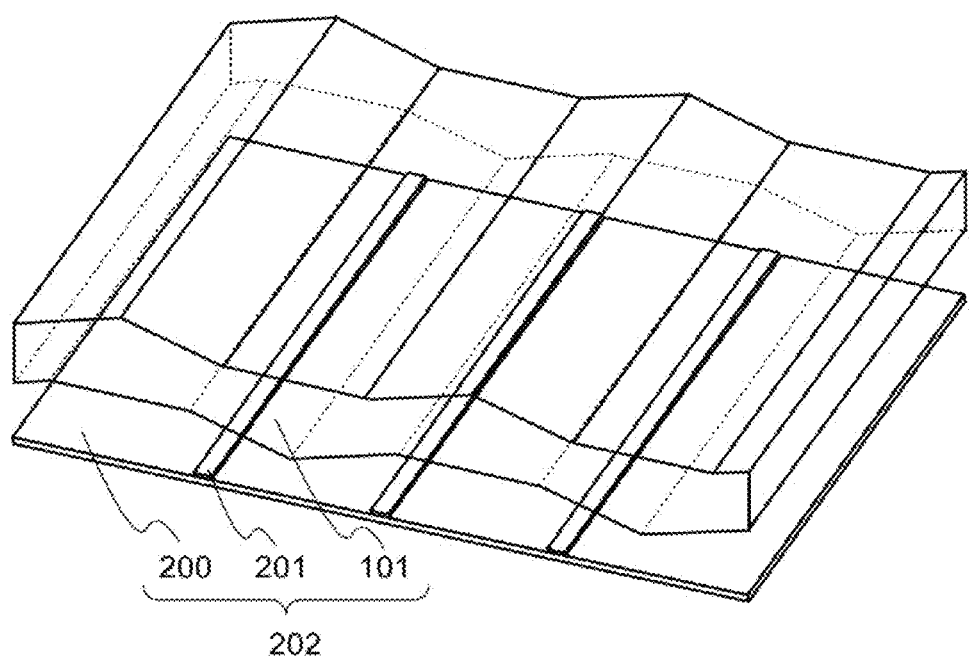
FIGS. 3A and 3B are a perspective view and a cross-sectional view illustrating an example of a lens sheet and a photoelectric conversion module.
Figure 3B:
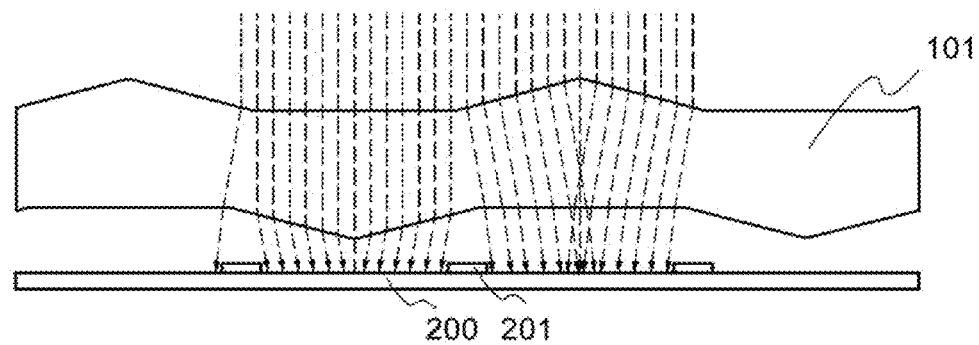

A lens sheet 101 which is one embodiment of the present invention and illustrated in a perspective view of FIG. 3A and a cross-sectional view of FIG. 3B differs from that of FIGS. 1A and 1B in having prismatic lens regions. Prisms of lens regions on a first side and lens regions on a second side of the lens sheet 101 may have the same or different heights and angles. With the prismatic lens regions on the first and second sides, a larger region of the photoelectric conversion element 200 can be irradiated with light having substantially the same intensity as light incident on the lens regions on the first side. When a larger region of the photoelectric conversion element 200 is uniformly irradiated with light, photoelectric conversion efficiency can be improved. Accordingly, the photoelectric conversion module 202 can have high efficiency. The description of FIGS. 1A and 1B can be referred to except for the shape of the lens regions.

Figure 4A:
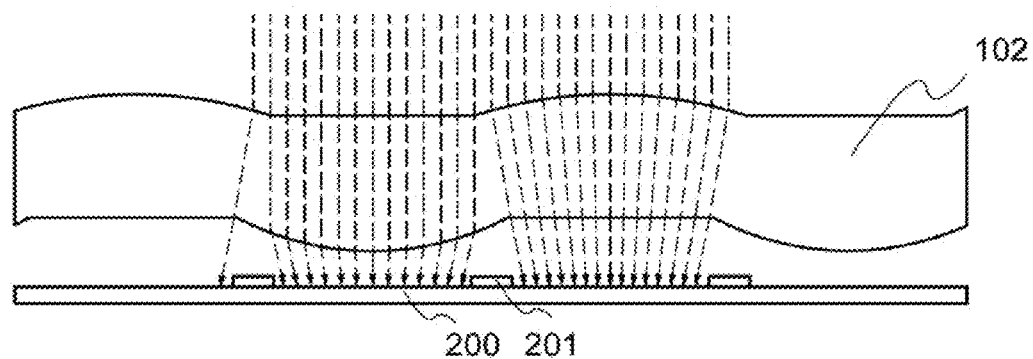
FIGS. 4A and 4B are cross-sectional views each illustrating an example of a lens sheet and a photoelectric conversion module.

A lens sheet 102 which is one embodiment of the present invention and illustrated in a cross-sectional view of FIG. 4A differs from that of. FIGS. 1A and 1B in that lens regions on a first side and lens regions on a second side have different curvature radii. When the lens regions on the first side have a longer curvature radius than the lens regions on the second side, the photoelectric conversion element 200 can be more uniformly irradiated with light. By uniformly irradiating the photoelectric conversion element 200 with light, photoelectric conversion efficiency can be improved. Accordingly, the photoelectric conversion module 202 can have higher efficiency. The description of FIGS. 1A and 1B can be referred to except for the shape of the lens regions.

Figure 4B:
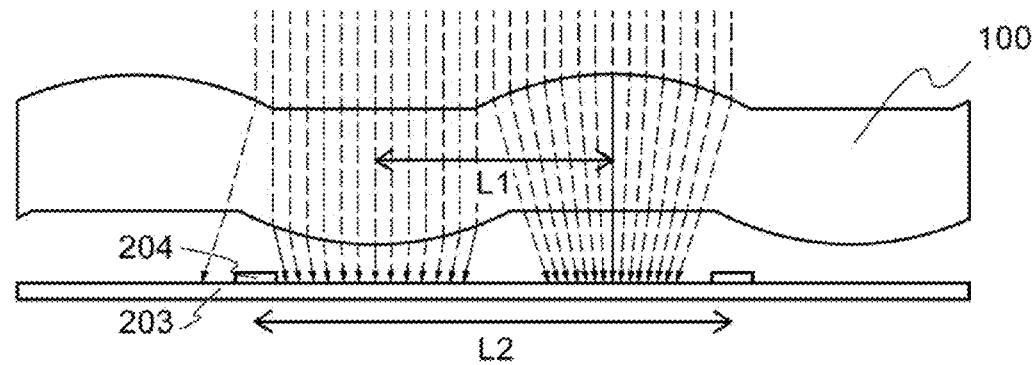

A photoelectric conversion module which is one embodiment of the present invention and illustrated in FIG. 4B differs from that of FIGS. 1A and 1B in the disposition of grid electrodes 204. In FIG. 4B, the pitch L2 of the grid electrodes 204 is twice as long as the pitch L1 between the top of each lens region on a first side and the top of each lens region on a second side of the lens sheet 100. Note that L2 in one embodiment of the present invention is not limited to being twice as long as L1, as long as it is an integer multiple. With such a disposition, a photoelectric conversion element 203 can be irradiated with light incident on the lens sheet 100 without loss. The description of FIGS. 1A and 1B can be referred to except for the disposition of the grid electrodes.

Figure 5A:
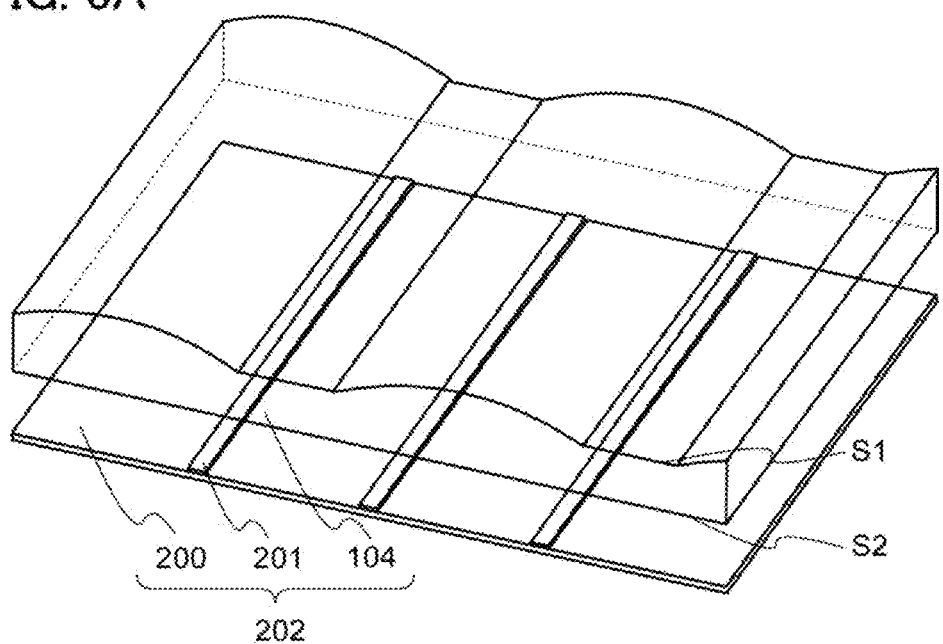
FIGS. 5A and 5B are a perspective view and a cross-sectional view illustrating an example of a lens sheet and a photoelectric conversion module.
Figure 5B:
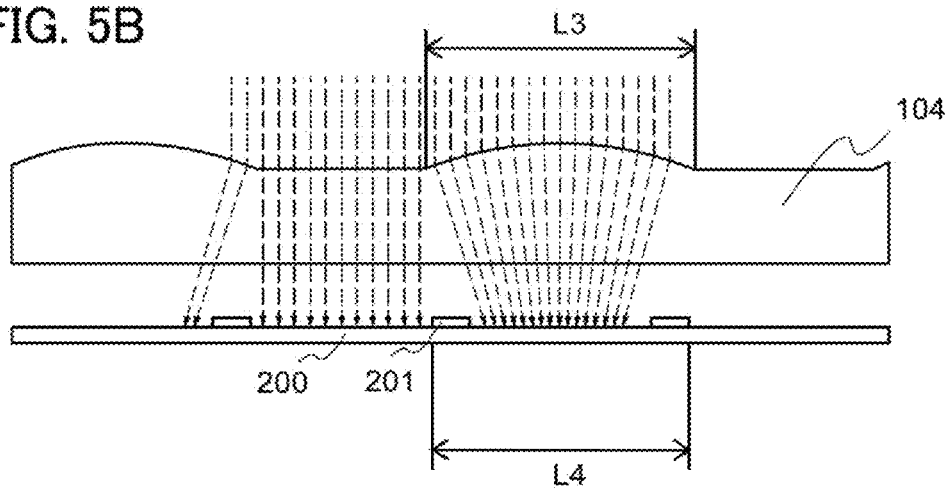

A lens sheet 104 which is one embodiment of the present invention and illustrated in a perspective view of. FIG. 5A and a cross-sectional view of FIG. 5B differs from that of FIGS. 1A and 1B in having lens regions only on a first side S1 and in the width of the lens regions. The width L3 of each lens region of the lens sheet 104 illustrated in FIG. 5B is set larger than or equal to the sum L4 of the width of a light-receiving portion below the lens region and the widths of two grid electrodes 201 between which the light-receiving portion is sandwiched. In addition, the width of each non-lens region is set smaller than the width of a light-receiving portion below the non-lens region. Furthermore, the photoelectric conversion element 200 and the grid electrodes 201 are disposed such that the grid electrodes 201 are positioned in a region which is created below the lens sheet 104 and which is not irradiated with light when light is incident on the lens sheet 104 from above.

When lens regions are provided only on one side as in the lens sheet 104, processing of a lens sheet can be facilitated. Furthermore, with the above-described disposition of the lens sheet 104, the photoelectric conversion element 200, and the grid electrodes 201, the photoelectric conversion element 200 can be irradiated with light incident on the lens sheet 104 without loss. Accordingly, the photoelectric conversion module 202 can have high efficiency. The description of FIGS. 1A and 1B can be referred to except for the side where the lens regions are provided and the width of the lens regions.

Figure 6A:
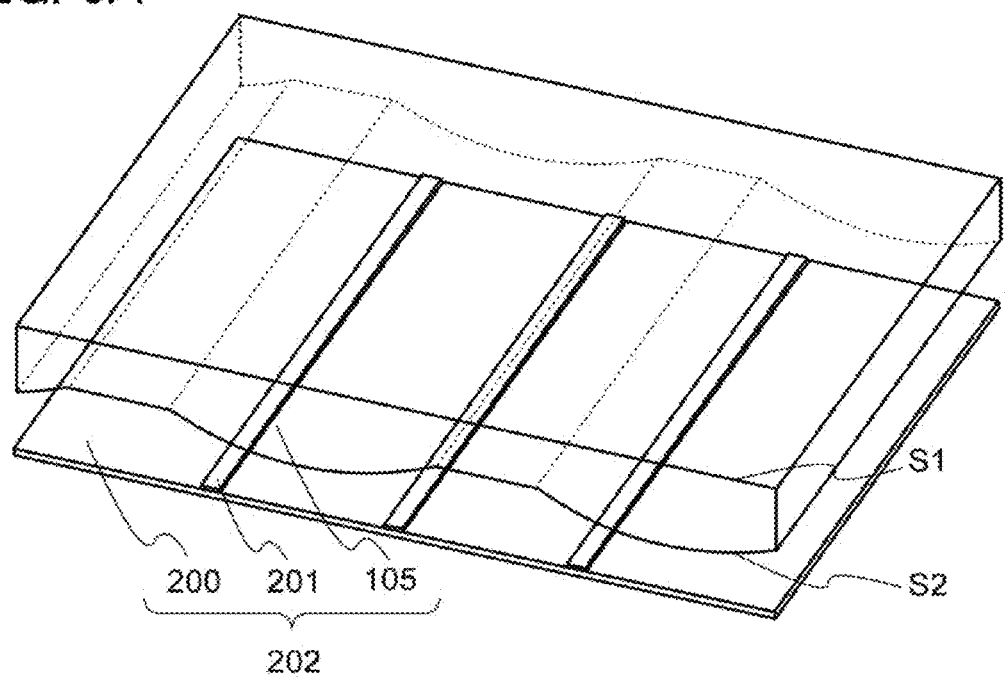
FIGS. 6A and 6B are a perspective view and a cross-sectional view illustrating an example of a lens sheet and a photoelectric conversion module.
Figure 6B:
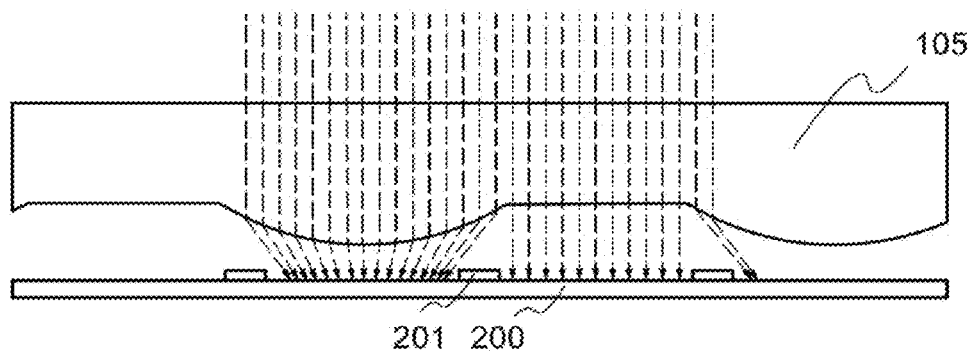

A lens sheet 105 which is one embodiment of the present invention and illustrated in a perspective view of FIG. 6A and a cross-sectional view of FIG. 6B differs from that of FIGS. 5A and 5B in having lens regions only on a second side S2. The description of FIGS. 5A and 5B can be referred to except for the side where the lens regions are provided.

Figure 7A:
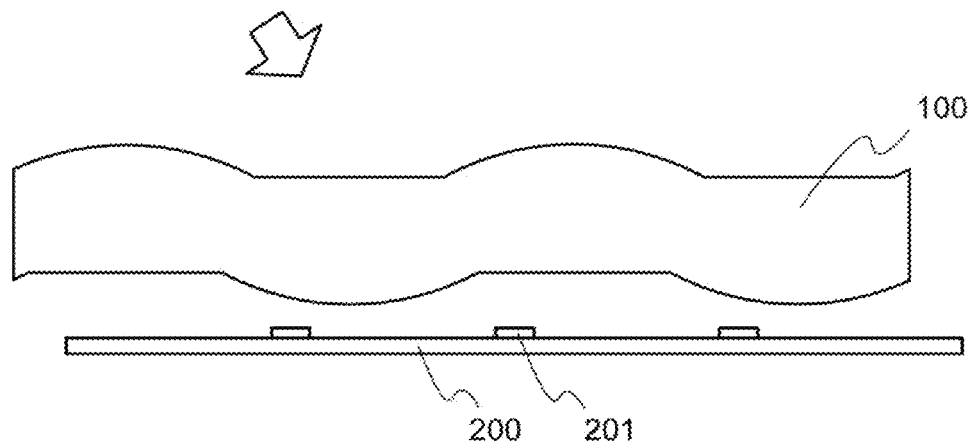
FIGS. 7A and 7B are cross-sectional views each illustrating an example of a lens sheet and a photoelectric conversion module.

A photoelectric conversion module which is one embodiment of the present invention and whose cross-sectional view Is given in FIG. 7A differs from that of FIGS. 1A and 1B in the disposition of the lens sheet 100, the photoelectric conversion element 200, and the grid electrodes 201.

Figure 7B:
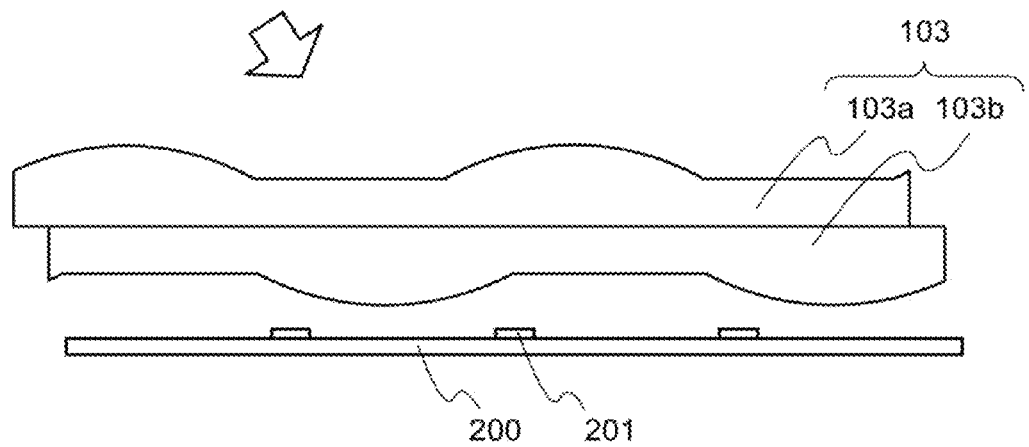

In FIGS. 7A and 7B, arrows indicate the light incident direction. In FIGS. 3A and 3B, FIGS. 4A and 4B, FIGS. 5A and 5B, and FIGS. 6A and 6B, light is incident on the lens arrays at substantially 0°. However, when light is obliquely incident on the lens sheet 100 as illustrated in FIGS. 7A and 7B, the regions which are created below the lens sheet 100 and which are not irradiated with light may be displaced and the grid electrodes 201 may be irradiated with light.

Thus, in the photoelectric conversion module 202 illustrated in FIG. 7A, at least either the lens sheet 100 or the photoelectric conversion element 200 and the grid electrode 201 is moved depending on the incident angle of incoming light. By the movement, the positional relationship between the grid electrodes 201 and the regions which are created below the lens sheet 100 and which are not irradiated with light can be controlled. Thus, light exiting from the lens sheet 100 can be efficiently delivered to the photoelectric conversion element 200 but not to the grid electrodes 201. Accordingly, even when light is incident obliquely, the photoelectric conversion module 202 can have high efficiency.

Note that the distance from the lens sheet 100 to the photoelectric conversion element 200 and the grid electrodes 201, the distance of the movement, and the like can be set as appropriate.

As illustrated in FIG. 7B, a lens sheet may have a two-layer structure: a lens sheet 103 including a lens sheet 103a and a lens sheet 103b. In the case of the two-layer structure, the lens sheet 103a having first lens regions and the lens sheet 103b having second lens regions can be moved different distances.

By moving at least one of the lens sheet 103a, the lens sheet 103b, and the photoelectric conversion element 200 and the grid electrodes 201, the positional relationship between the grid electrodes 201 and the regions which are created below the lens sheet 103 and which are not irradiated with light can be controlled. Thus, light exiting from the lens sheet 103 can be efficiently delivered to the photoelectric conversion element 200 but not to the grid electrodes 201.

Furthermore, when the lens sheet 103 has a two-layer structure and the lens sheet 103a and the lens sheet 103b are moved different distances, the photoelectric conversion element 200 can be more uniformly irradiated with light. By uniformly irradiating the photoelectric conversion element 200 with light, photoelectric conversion efficiency can be improved. Accordingly, the photoelectric conversion module 202 can have higher efficiency.

Note that a gap between the lens sheet 103a and the lens sheet 103b is preferably filled with a lubricant having substantially the same refractive index as the lens sheets. Accordingly, reflection at the interface between the lens sheet 103a and the lens sheet 103b can be suppressed.

Although the photoelectric conversion element 200 is disposed in front of the focus of the first lens regions or the second lens regions in each of FIGS. 3A and 3B, FIGS. 4A and 4B, FIGS. 5A and 5B, FIGS. 6A and 6B, and FIGS. 7A and 7B, the present invention is not limited to this embodiment. The photoelectric conversion element 200 may be disposed farther than the focus of at least either the first lens regions or the second lens regions so that the photoelectric conversion element 200 is irradiated with light that is diffused after being focused once.

Moreover, a lens sheet having a combination of features described in Embodiments 1 and 2 may be employed.

Embodiment 3

In this embodiment, examples of structures of photoelectric conversion elements and grid electrodes which can be applied to Embodiments 1 and 2 will be described with reference to FIGS. 8A to 8C.

Figure 8A:
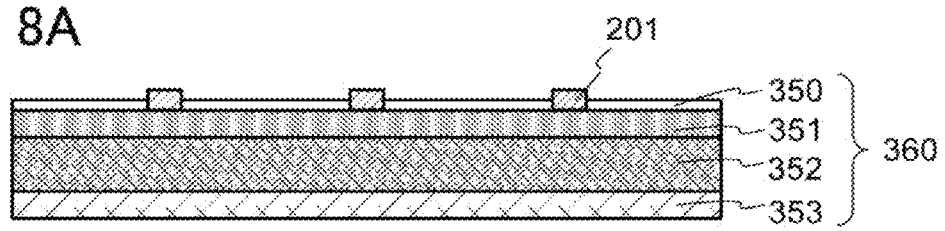
FIGS. 8A to 8C are cross-sectional views each illustrating an example of a photoelectric conversion element and a grid electrode.

FIG. 8A illustrates a photoelectric conversion element 360 and grid electrodes 201 which can be applied to one embodiment of the present invention. The grid electrodes 201 are provided over the photoelectric conversion element 360, and the photoelectric conversion element 360 includes a first semiconductor layer 351, a second semiconductor layer 352, and a conductive layer 353 in this order from the grid electrode side. An anti-reflective film 350 may be provided over the first semiconductor layer.

A metal can be used as a material of the grid electrodes 201 and the conductive layer 353. For the grid electrodes 201, silver which has high electrical conductivity and is unlikely to diffuse into a semiconductor layer is preferably used. For the conductive layer 353, nickel, stainless steel, titanium, tantalum, tungsten, molybdenum, or the like can be used, and when provided between these metals, aluminum can also be used.

For the semiconductor layers, a single crystal semiconductor, a polycrystalline semiconductor, a microcrystalline semiconductor, or an amorphous semiconductor can be used. Alternatively, a low-resistance semiconductor may be used. In FIG. 8A, light is delivered from above; thus, it is preferable that the first semiconductor layer 351 be p-type and the second semiconductor layer 352 be n-type.

Figure 8B:
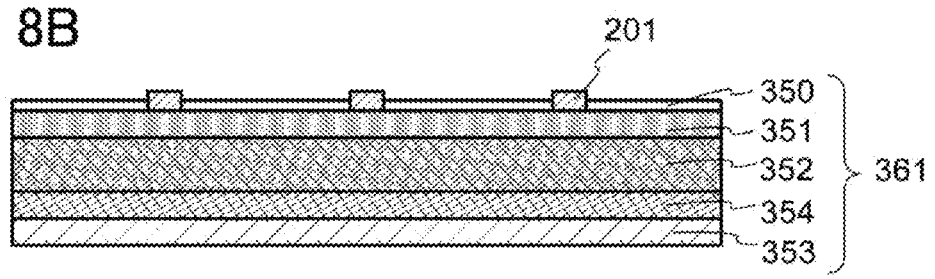

FIG. 8B illustrates a photoelectric conversion element 361 and grid electrodes 201. The photoelectric conversion element 361 includes a first semiconductor layer 351, a second semiconductor layer 352, a third semiconductor layer 354, and a conductive layer 353 in this order from the grid electrode side. As for the semiconductor layers of the photoelectric conversion element, the first semiconductor layer may be p-type and the second and third semiconductor layers may be n-type. Alternatively, the first semiconductor layer may be p-type, the second semiconductor layer may be i-type, and the third semiconductor layer may be n-type. The description of FIG. 8A can be referred to except for the semiconductor layers.

In one embodiment of the present invention, a multi-junction photoelectric conversion element having a plurality of PIN junctions may be employed. For example, as illustrated in FIG. 8C, grid electrodes 201 may be provided on both sides, between which a photoelectric conversion element 362 may be provided. The photoelectric conversion element 362 includes light-transmitting conductive layers 355$a$ and 355$b$, p-type or n-type semiconductor layers 356$a$ and 356$b$, i-type semiconductor layers 357$a$ and 357$b$, and an n-type or p-type semiconductor layer 358.

For the light-transmitting conductive layers 355$a$ and 355$b$, indium oxide-tin oxide (ITO), zinc oxide (ZnO), tin oxide ($SnO_2$), or the like can be used.

Because the photoelectric conversion element 362 is capable of photoelectric conversion on both sides, lens arrays may be disposed in upper and lower portions of a photoelectric conversion module.

Figure 8C:
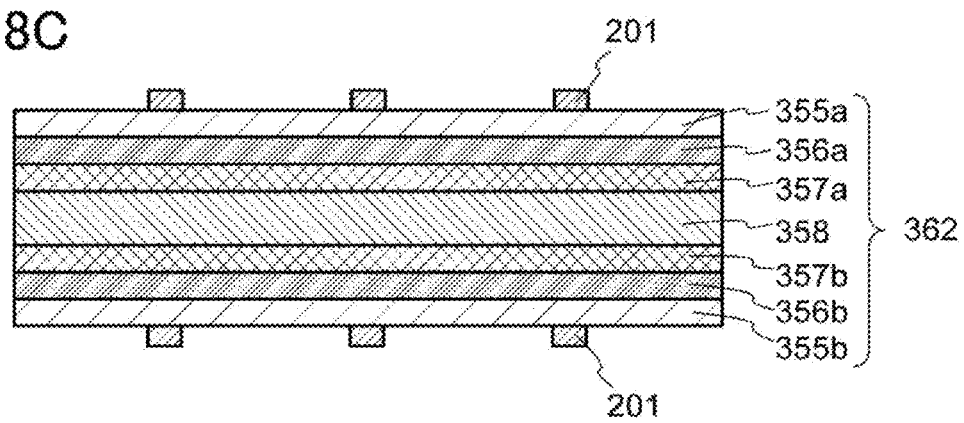

Note that at least one of the semiconductor layers 351, 352, 354, 356$a$, 356$b$, 357$a$, 357$b$, and 358 of the photoelectric conversion elements 360, 361, and 362 illustrated in FIGS. 8A to 8C may be provided with an uneven structure. Such an uneven structure makes it possible to provide a light-trapping effect and to improve photoelectric conversion efficiency.

One embodiment of the present invention may be applied to a photoelectric conversion module including a thin film of silicon such as microcrystalline silicon or amorphous silicon.

Embodiment 4

In this embodiment, a solar power generation system including a lens sheet and a photoelectric conversion module according to one embodiment of the present invention will be described with reference to FIG. 9.

Figure 9:
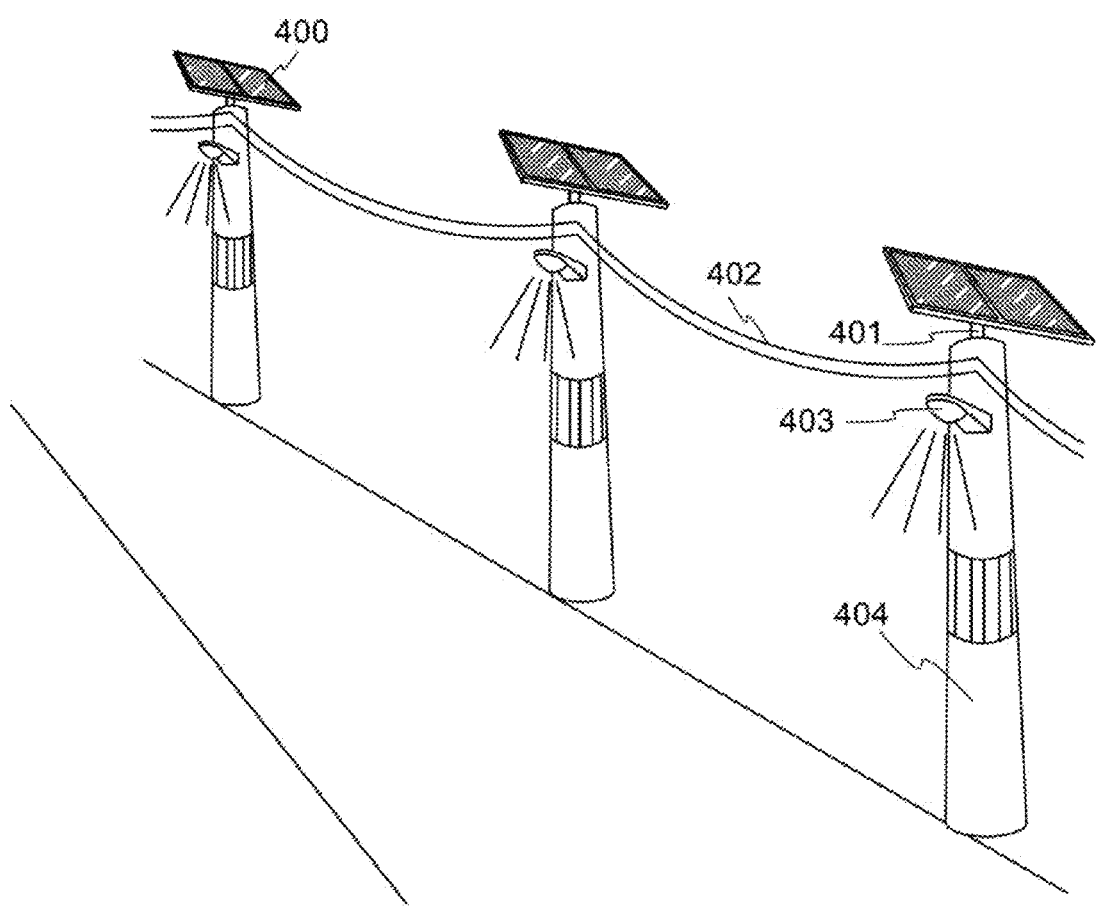
FIG. 9 illustrates an example of a solar power generation system.

FIG. 9 illustrates utility poles equipped with lighting devices, each of which includes a photoelectric conversion module 400, a photoelectric conversion module installation mechanism 401, a power transmission line 402, a lighting device 403, and a utility pole 404. The lighting device 403 can be turned on with electric power generated by the photoelectric conversion module 400. The photoelectric conversion module 400, to which one embodiment of the present invention is applied, can efficiently convert incident light into electric power and can thus generate a large amount of electric power.

The photoelectric conversion module installation mechanism 401 may be movable to achieve a tracking-type solar power generation system. In addition, the photoelectric conversion module 400 may include a focusing lens to achieve a focusing- and tracking-type solar power generation system. In a tracking- or focusing-type solar power generation system, the photoelectric conversion module 400 can be more efficiently irradiated with sunlight. In a tracking-type solar power generation system, the incident angle of sunlight on the photoelectric conversion module 400 can be decreased. It is preferable that the incident angle of light can be decreased with the photoelectric conversion module installation mechanism 401 because the degree of freedom for design of a lens sheet and a photoelectric conversion module according to one embodiment of the present invention can be increased.

Example 1

In this example, the results of calculating the disposition of a lens sheet and a photoelectric conversion module according to one embodiment of the present invention in the case where light is incident on the lens sheet perpendicularly will be described with reference to FIG. 10 and FIGS. 11A and 11B.

First, the disposition of a lens sheet 102, a photoelectric conversion element 200, and grid electrodes 201 which are one embodiment of the present invention was calculated under the following conditions. The lens sheet 102 has lens regions which are cylindrical lenses on a first side and a second side, and the curvature radius of each lens region on the first side differs from the curvature radius of each lens region on the second side. FIG. 10 shows the results. Note that illumination design and analysis software "LightTools" by Synopsys, Inc. was used for all calculations in examples below.

Figure 10:
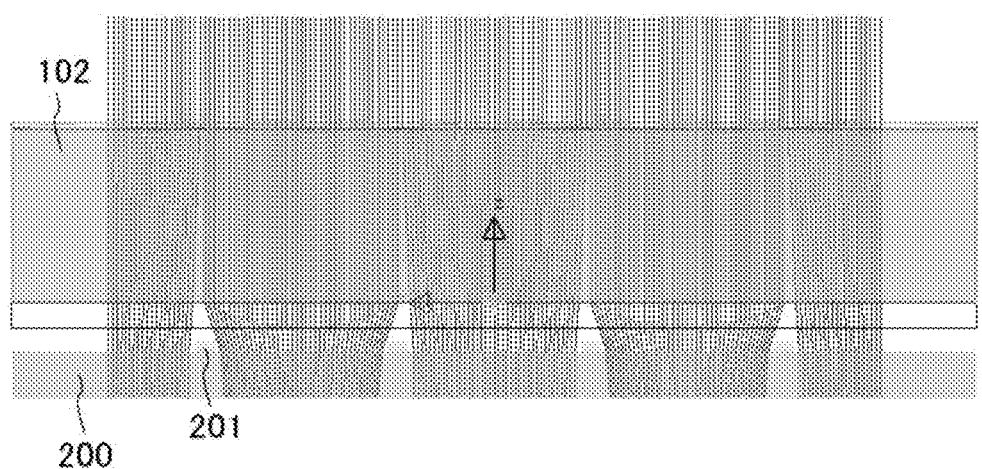
FIG. 10 shows calculation results of an example of a lens sheet.

<Calculation Conditions for FIG. 10>
The width D1 of each First lens region: 2 mm
The width D2 of each second lens region: 2.01 mm
The width of the overlap between the first lens region and the second lens region: 0.01 mm
The thickness t0 of the lens sheet: 2 mm
The curvature radius R1 of the first lens region: 7.3 mm
The curvature radius: R2 of the second lens region: 2 mm
The refractive index n of the lens sheet: 1.5
The distance from the second lens region to the photoelectric conversion element 200: 0.5 mm
The width of each grid electrode: 0.2 mm
The height of the grid electrode: 0.1 mm
As a result of the calculation, the spot a and the widths of light with which the photoelectric conversion element 200 is irradiated through the lens sheet 102 are as follows.

<Calculation Results of FIG. 10>
The spot α: 1.82 mm.
The width of light with which the photoelectric conversion element is irradiated through the first lens region: 1.75 mm
The width of light with which the photoelectric conversion element is irradiated through a first non-lens region: 1.75 mm.
The above results and FIG. 10 show that light incident on the lens sheet 102 is delivered to the photoelectric conversion element 200 but not to the grid electrodes 201.

Next, calculation was conducted under the above conditions with a different width of the overlap between the first lens region and the second lens region. FIG. 11A shows the results.

Figure 11A:
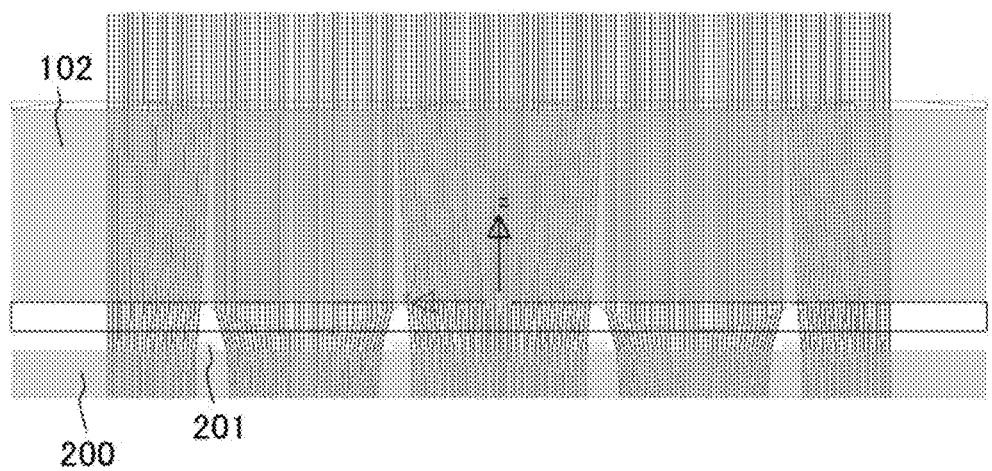
FIGS. 11A and 11B show calculation results of an example of a lens sheet.
Figure 11B:
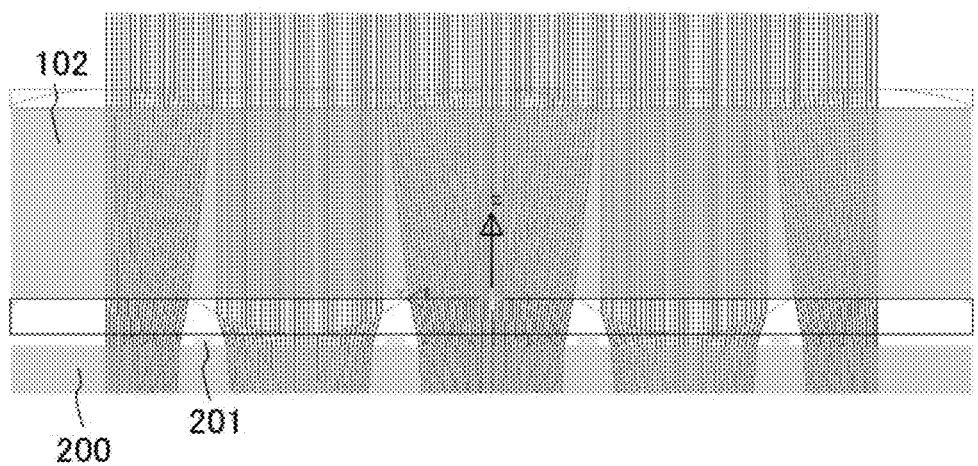

<Calculation Conditions for FIG. 11A>
The width D1 of each first lens region: 2.1 mm
The width D2 of each second lens region: 2.1 mm The width of the overlap between the first lens region and the second lens region: 0.1 mm
The thickness t0 of the lens sheet: 2 mm
The curvature radius R1 of the first lens region: 6 mm
The curvature radius R2 of the second lens region: 2 mm
The refractive index n of the lens sheet: 1.5
The distance from the second lens region to the photoelectric conversion element 200: 0.5 mm
The width of each grid electrode: 0.2 mm
The height of the grid electrode: 0.1 mm As a result of the calculation, the spot a and the widths of light with Which the photoelectric conversion element 200 is irradiated through the lens sheet 102 are as follows.
<Calculation Results of FIG. 11A>
The spot α: 1.87 mm
The width of light with which the photoelectric conversion element is irradiated through the first lens region: 1.78 mm
The width of light with which the photoelectric conversion element is irradiated through a first non-lens region: 1.66 mm The above results and FIG. 11A show that light incident on the lens sheet 102 is delivered to the photoelectric conversion element 200 but not to the grid electrodes 201.

Next, calculation was conducted under the above conditions with a different width of the overlap between the first lens region and the second lens region. FIG. 11B shows the results.
<Calculation Conditions for FIG. 11B>
The width D1 of each first lens region: 2.2 mm
The width D2 of each second lens region: 2.2 mm
The width of the overlap between the first lens region and the second lens region: 0.2 mm
The thickness t0 of the lens sheet: 2 mm
The curvature radius R1 of the first lens region: 3 mm
The curvature radius R2 of the second lens region: 1.8 mm
The refractive index n of the lens sheet: 1.5
The distance from the second lens region to the photoelectric conversion element 200: 0.5 mm
The width of each grid electrode: 0.2 mm
The height of the grid electrode: 0.1 mm As a result of the calculation, the spot a and the widths of light with which the photoelectric conversion element 200 is irradiated through the lens sheet 102 are as follows.
<Calculation Results of FIG. 11B>
The spot α: 1.71 mm
The width of light with which the photoelectric conversion element is irradiated through the first lens region: 1.55 mm
The width of light with which the photoelectric conversion element is irradiated through a first non-lens region: 1.55 mm The above results and FIG. 11B show that light incident on the lens sheet 102 is delivered to the photoelectric conversion element 200 but not to the grid electrodes 201.

Example 2

In this example, the results of calculating the disposition of a lens sheet and a photoelectric conversion module according to one embodiment of the present invention in the case where light is incident on the lens array obliquely, will be described with reference to FIGS. 12A and 12B and FIGS. 13A and 13B.

Figure 12A:
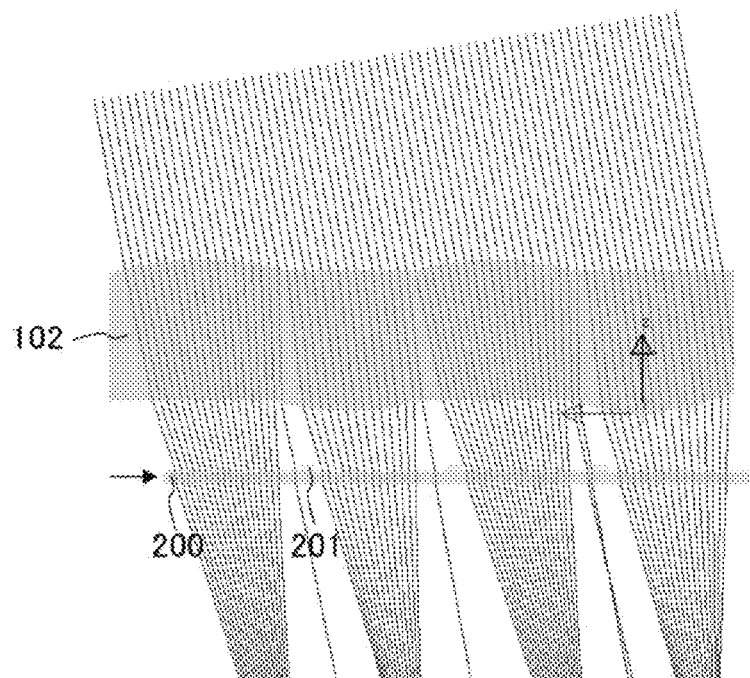
FIGS. 12A and 12B show calculation results of an example of a lens sheet.

First, the disposition of a lens sheet 102 having lens regions which are cylindrical lenses on a first side and a second side, a photoelectric conversion element 200, and grid electrodes 201 which are one embodiment of the present invention was calculated under the following conditions. FIG. 12A shows the results. Note that in this example, the distance of movement of the photoelectric conversion element 200 and the grid electrodes 201 is the distance of movement thereof to the right of the diagram; the distance of movement of the photoelectric conversion element 200 and the grid electrodes 201 to the right of the diagram may be the distance of movement of the lens sheet 102 to the left of the diagram.
<Calculation Conditions for FIG. 12A>
The width D1 of each first lens region: 2.3 mm
The width D2 of each second lens region: 1.9 mm
The width of the overlap between the first lens region and the second lens region: 0.1 mm
The thickness t0 of the lens sheet: 2 mm
The curvature radius R1 of the first lens region: 4 mm
The curvature radius R2 of the second lens region: 3 mm
The refractive index n of the lens sheet: 1.5
The distance from the second lens region to the photoelectric conversion element 200: 1 mm
The width of each grid electrode: 0.2 mm
The height of the grid electrode: 0.1 min
The incident angle: 10°
The distance of movement of the photoelectric conversion element 200 and the grid electrodes 201: 0.45 mm FIG. 12A shows that light incident on the lens sheet 102 is delivered to the photoelectric conversion element 200 but not to the grid electrodes 201.

Figure 12B:
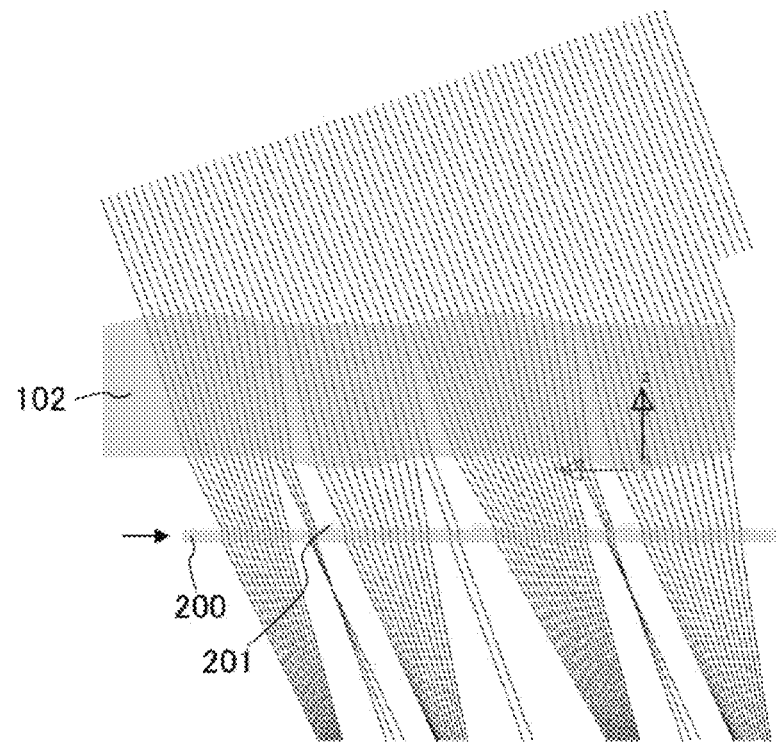

Next, calculation was conducted under the above conditions with a different incident angle and a different distance of movement of the photoelectric conversion element 200 and the grid electrodes 201 as given below. FIG. 12B shows the results.
<Calculation Conditions for FIG. 12B>
The incident angle: 20°
The distance of movement of the photoelectric conversion element 200 and the grid electrodes 201: 0.8 mm FIG. 12B shows that light incident on the lens sheet 102 is delivered to the photoelectric conversion element 200 but not to the grid electrodes 201.

Figure 13A:
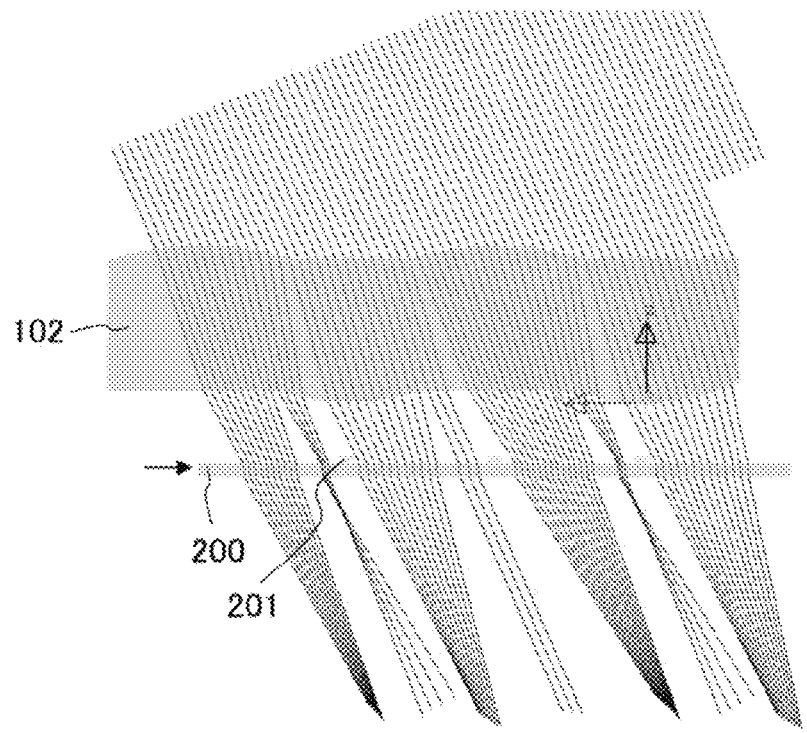
FIGS. 13A and 13B show calculation results of an example of a lens sheet.

Next, calculation was conducted under the above conditions with a different incident angle and a different distance of movement of the photoelectric conversion element 200 and the grid electrodes 201 as given below. FIG. 13A shows the results.
<Calculation Conditions for FIG. 13A>
The incident angle: 23.4°
The distance of movement of the photoelectric conversion element 200 and the grid electrodes 201: 0.95 mm FIG. 13A shows that light incident on the lens sheet 102 is delivered to the photoelectric conversion element 200 but not to the grid electrodes 201.

The calculation results in FIGS. 12A and 12B and FIG. 13A show that light can be efficiently delivered to the photoelectric conversion element 200 but not to the grid electrodes 201 by moving the photoelectric conversion element 200 and the grid electrodes 201, or the lens sheet 102, as appropriate depending on the incident angle of light on the lens sheet 102.

Figure 13B:
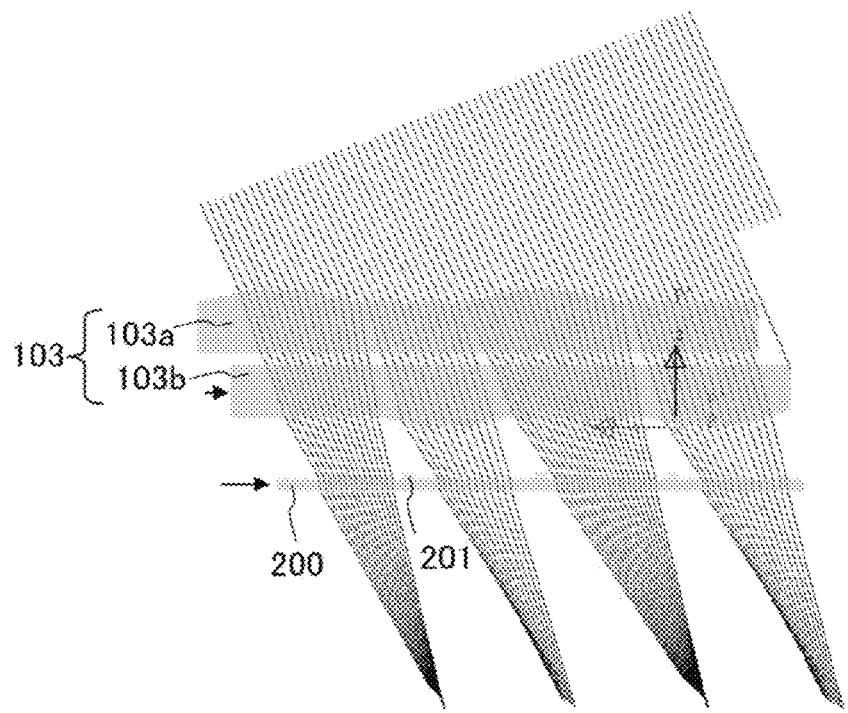

Next, the disposition of a lens sheet 103 having a two-layer structure of a lens sheet 103*a* and a lens sheet 103*b*, a photoelectric conversion element 200, and grid electrodes 201 which are one embodiment of the present invention was calculated under the following conditions. FIG. 13B shows the results.
<Calculation Conditions for FIG. 13B>
The incident angle: 23.4°
The distance of movement of the lens sheet 103*b*: 0.5 mm
The distance of movement of the photoelectric conversion element 200 and the grid electrodes 201: 0.95 mm The calculation results in FIG. 13B show that light can be efficiently delivered to the photoelectric conversion element 200 but not to the grid electrodes 201 by moving the lens sheet 103b, the photoelectric conversion element 200, and the grid electrodes 201 as appropriate depending on the incident angle of light on the lens sheet 103. The results also show that the photoelectric conversion element 200 can be more uniformly irradiated with light.

Comparative Example 1

In this comparative example, the results of calculating the disposition of a lens sheet having series of lens regions on both sides and having the lens arrays on both sides shifted by half the pitch and a photoelectric conversion module will be described with reference to FIG. 14. Note that light is incident on the lens sheet perpendicularly.

The disposition of a lens sheet 302 having series of lens regions on both sides and having the lens arrays on both sides shifted by half the pitch, a photoelectric conversion element 200, and grid electrodes 201 was calculated under the following conditions. FIG. 14 shows the results. The lens sheet 302 having series of lens regions cannot practically have an ideal shape at boundaries between lens regions in a precise sense because there is a limitation on processing accuracy. Therefore, round regions or flat regions which do not sufficiently function as lenses are created in boundary portions between the lens regions. Thus, it was assumed that the boundary portions between the lens regions of the lens sheet 302 each had a flat surface with a width of 0.1 mm because of processing limitation.

Figure 14:
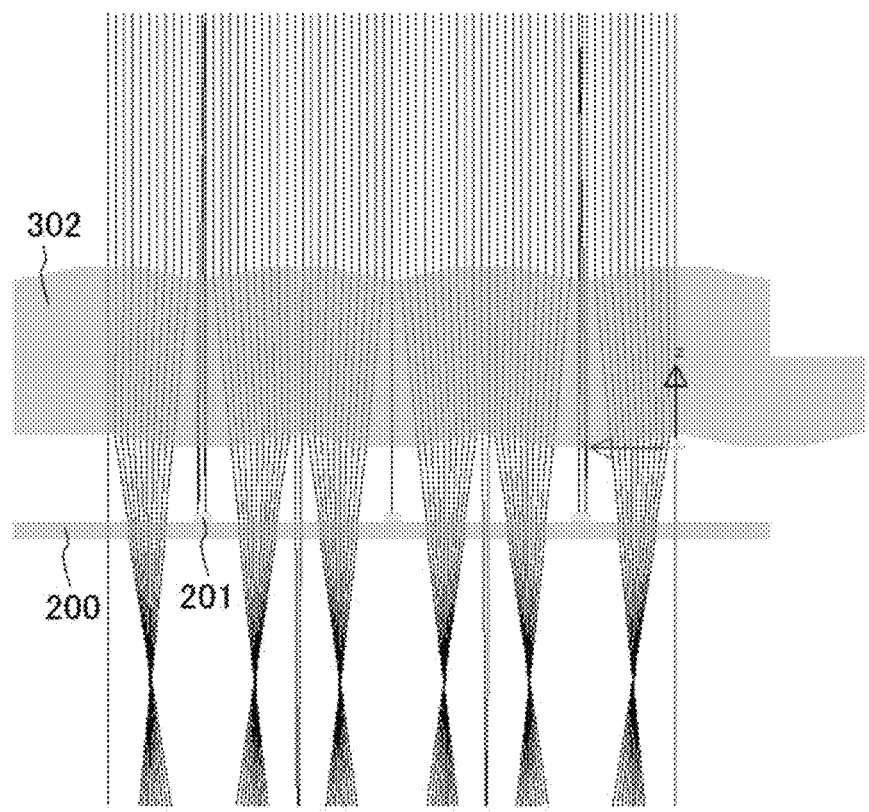
FIG. 14 shows calculation results of a comparative example of a lens sheet.
Figure 15A:
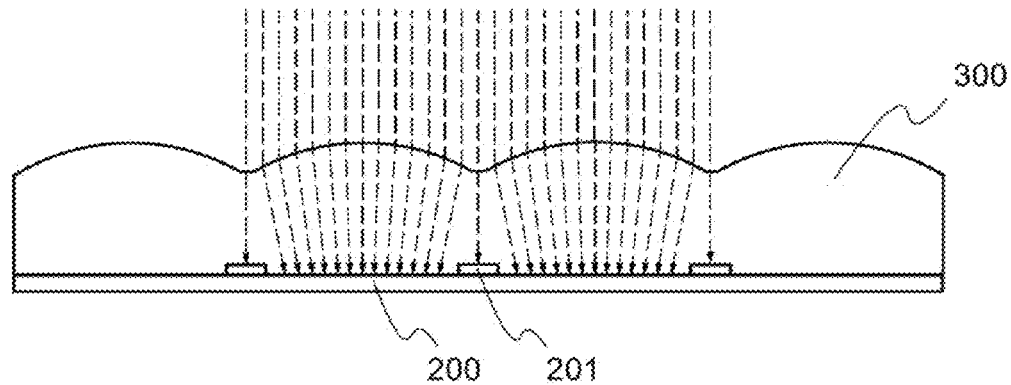
FIGS. 15A to 15C are cross-sectional views each illustrating a conventional example of a lens sheet.
Figure 15B:
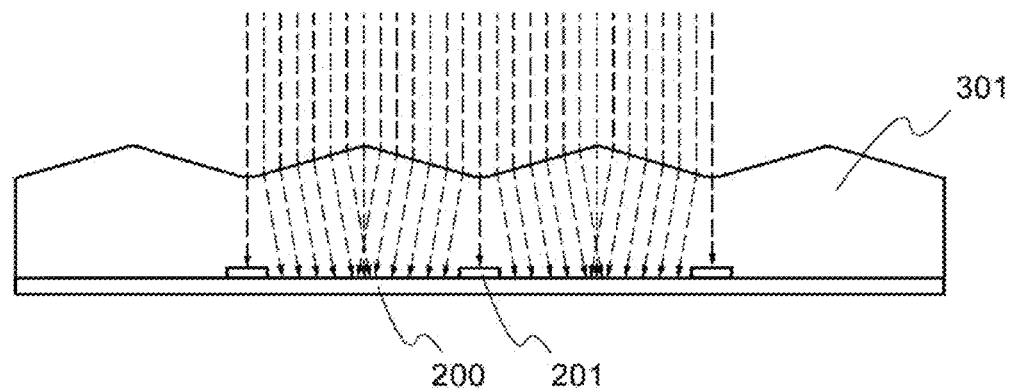
Figure 15C:
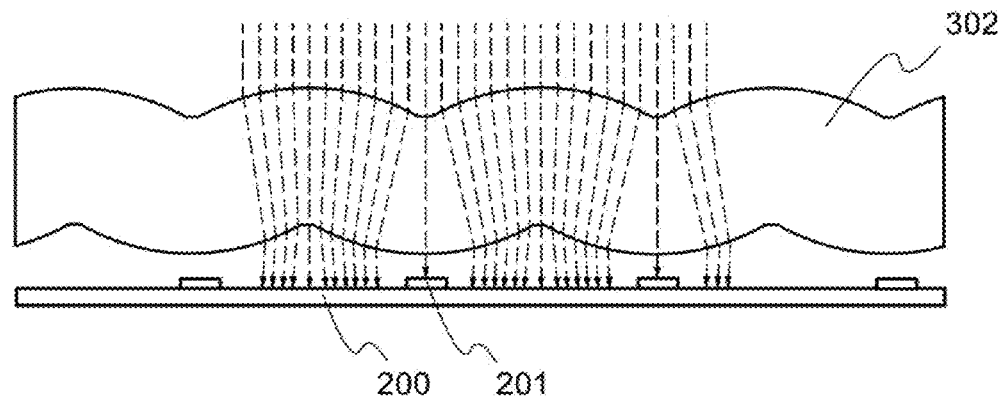

<Calculation Conditions for FIG. 14>.

The width D1 of each first lens region: 1.9 mm

The width D2 of each second lens region: 1.9 mm

The flat surface at the boundary between lens regions: 0.1 mm

The thickness t0 of the lens sheet excluding the lens regions: 2 mm

The curvature radius R1 of the first lens region: 3 mm

The curvature radius R2 of the second lens region: 3 mm

The refractive index n of the lens sheet: 1.5

The distance from the second lens region to the photoelectric conversion element 200: 1 mm The width of each grid electrode: 0.2 mm The height of the grid electrode: 0.1 mm As in FIG. 14, light incident on the boundary portions travels rectilinearly without being refracted satisfactorily. The light is perpendicular to the lens regions on the second side; therefore, it is shown that the light travels rectilinearly without being refracted satisfactorily even by the lens regions on the second side and is delivered to the grid electrodes 201.

Examples 1 and 2 and Comparative Example 1 described above reveal that with the use of a lens sheet which is one embodiment of the present invention, light incident on the lens sheet is delivered to the photoelectric conversion element 200 but not to the grid electrodes 201.

This application is based on Japanese Patent Application serial no. 2011-054598 filed with Japan Patent Office on Mar. 11, 2011, the entire contents of which are hereby incorporated by reference.

What is claimed is:

1. A lens sheet comprising:
a first surface comprising first convex surfaces and a first flat surface in each region between the first convex surfaces; and
a second surface comprising second convex surfaces and a second flat surface in each region between the second convex surfaces,
wherein each of the first convex surfaces and a corresponding second flat surface overlap with each other,
wherein each of the second convex surfaces and a corresponding first flat surface overlap with each other, and
wherein a relationship expressed by Formula (1) is established, $$d \geq \alpha = D\frac{RC - tn}{RC} \quad (1)$$

where D is a width of each of the first convex surfaces, d is a width of each of the second flat surfaces, t is a thickness of the lens sheet, R is a curvature radius of each of the first convex surfaces, n is a refractive index of the lens sheet, $\alpha$ is a width of a region of each of the second flat surfaces from which light incident on and focused b a corresponding first convex surface exits, and C is a constant satisfying 4.4<C<4.6.

2. A photoelectric conversion module comprising:
a photoelectric conversion element;
grid electrodes over the photoelectric conversion element; and
the lens sheet according to claim 1 over the grid electrodes,
wherein the photoelectric conversion element, the grid electrodes, and the lens sheet are disposed such that the grid electrodes are not irradiated with light exiting from the second surface of the lens sheet which faces the photoelectric conversion element.

3. A photoelectric conversion module comprising:
a photoelectric conversion element;
grid electrodes over the photoelectric conversion element; and
the lens sheet according to claim 1 over the grid electrodes,
wherein each of the grid electrodes, an end portion of a corresponding first convex surface, and an end portion of a corresponding second convex surface overlap with one another.

4. A lens sheet comprising:
a first surface comprising a first convex surface, a second convex surface, and a first flat surface between the first convex surface and the second convex surface; and
a second surface comprising a second flat surface, a third flat surface, and a third convex surface between the second flat surface and the third flat surface,
wherein a first end portion of the third convex surface and an end portion of the first convex surface overlap with each other,
wherein a second end portion of the third convex surface and an end portion of the second convex surface overlap with each other, and
wherein a relationship expressed by Formula (1) is established, $$d \geq \alpha = D\frac{RC - tn}{RC} \quad (1)$$

where D is a width of the first convex surface, d is a width of the second flat surface, t is a thickness of the lens sheet, R is a curvature radius of the first convex surface, n is a refractive index of the lens sheet, $\alpha$ is a width of a region of the second flat surface from which light incident on and focused by the first convex surface exits, and C is a constant satisfying 4.4<C<4.6.

5. A photoelectric conversion module comprising:
a photoelectric conversion element;
a grid electrode over the photoelectric conversion element; and
the lens sheet according to claim 4 over the grid electrode,
wherein the photoelectric conversion element, the grid electrode, and the lens sheet are disposed such that the grid electrode is not irradiated with light exiting from the second surface of the lens sheet which faces the photoelectric conversion element.

6. A photoelectric conversion module comprising:
a photoelectric conversion element;
a grid electrode over the photoelectric conversion element; and
the lens sheet according to claim 4 over the grid electrode,
wherein the grid electrode, an end portion of the first convex surface, and an end portion of the third convex surface overlap with one another.

7. A lens sheet comprising:
a first lens array on a front side; and
a second lens array on a back side,
wherein the first lens array comprises a first lens region and a first non-lens region placed alternately,
wherein the second lens array comprises a second lens region and a second non-lens region placed alternately,
wherein a middle portion of the first lens region overlaps with the second non-lens region,
wherein the first non-lens region overlaps with a middle portion of the second lens region,
wherein an end portion of the first lens region overlaps with an end portion of the second lens region, and
wherein a relationship expressed by Formula (1) is established, $$d \geq \alpha = D\frac{RC - tn}{RC} \quad (1)$$

where D is a width of the first lens region, d is a width of the second non-lens region, t is a thickness of the lens sheet, R is a curvature radius of the first lens region, n is a refractive index of the lens sheet, $\alpha$ is a width of a region of the second non-lens region from which light incident on and focused by the first lens region exits, and C is a constant satisfying 4.4<C<4.6.

8. The lens sheet according to claim 7, wherein at least one of the first lens region and the second lens region is a cylindrical lens.

9. The lens sheet according to claim 7, wherein at least one of the first lens region and the second lens region is a prismatic lens.

10. A photoelectric conversion module comprising:
the lens sheet according to claim 7;
a photoelectric conversion element below the lens sheet with the first lens array on an upper side and the second lens array on a lower side; and
a grid electrode over the photoelectric conversion element,
wherein the photoelectric conversion element and the grid electrode are disposed such that the grid electrode is not irradiated with light exiting from the second lens array which faces the photoelectric conversion element.

* * * * *

UNITED STATES PATENT AND TRADEMARK OFFICE
CERTIFICATE OF CORRECTION

PATENT NO.         : 8,878,123 B2
APPLICATION NO.    : 13/412016
DATED              : November 4, 2014
INVENTOR(S)        : Koichiro Tanaka et al.

Page 1 of 1

It is certified that error appears in the above-identified patent and that said Letters Patent is hereby corrected as shown below:

In the Specification:

Col. 1, line 6, "Field of the invention" should read --Field of the Invention--

Col. 1, line 47, "No. 2009-1.62843" should read --No. 2009-162843--

Col. 1, line 56, "no space there-between" should read --no space there between--

Col. 2, line 27, "it an object of" should read --it is an object of--

Col. 4, lines 51, "more of fight" should read --more of light--

Col. 5, line 12, "spot a." should read --spot α.--

Col. 5, line 12, "a denotes" should read --α denotes--

Col. 6, line 57, "from that of. FIGS. 1A" should read --from that of FIGS. 1A--

Col. 7, line 15, "view of. FIG. 5A and" should read --view of FIG. 5A and--

Col. 7, lines 47-48, "view Is given in FIG. 7A" should read --view is given in FIG. 7A--

Col. 10, line 37, "each First lens" should read --each first lens--

Col. 10, line 43, "radius: R2" should read --radius R2--

Col. 10, line 49, "spot a" should read --spot α--

Col. 10, lines 53, "1.82 mm." should read --1.82 mm--

Signed and Sealed this
Fourteenth Day of April, 2015

Michelle K. Lee
*Director of the United States Patent and Trademark Office*